US006302576B1

(12) United States Patent
Ono et al.

(10) Patent No.: US 6,302,576 B1
(45) Date of Patent: Oct. 16, 2001

(54) SOFT DECISION ESTIMATION UNIT AND MAXIMUM-LIKELIHOOD SEQUENCE ESTIMATION UNIT

(75) Inventors: Shigeru Ono; Hiroshi Hayashi; Tomoko Tanaka; Noriaki Kondoh, all of Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 08/495,456

(22) PCT Filed: Mar. 10, 1994

(86) PCT No.: PCT/JP94/00386

§ 371 Date: Jul. 28, 1995

§ 102(e) Date: Jul. 28, 1995

(87) PCT Pub. No.: WO95/15034

PCT Pub. Date: Jun. 1, 1995

(30) Foreign Application Priority Data

Nov. 29, 1993 (JP) .................................................. 5-297847

(51) Int. Cl.[7] ............................ G06F 11/10; H03M 13/12
(52) U.S. Cl. ..................... 371/43.6; 371/43.7; 371/43.8; 375/262; 375/341
(58) Field of Search ....................... 371/43, 43.4–43.8; 375/341–347, 229, 262, 340

(56) References Cited

U.S. PATENT DOCUMENTS

| | | |
|---|---|---|
| 5,134,635 | 7/1992 | Hong et al. ........................... 375/341 |
| 5,142,551 * | 8/1992 | Borth et al. ........................... 375/341 |
| 5,144,644 * | 9/1992 | Borth .................................... 375/341 |
| 5,271,042 * | 12/1993 | Borth et al. ........................... 375/348 |
| 5,414,738 * | 5/1995 | Bienz .................................... 375/341 |
| 5,471,500 * | 11/1995 | Blaker et al. ......................... 375/340 |

FOREIGN PATENT DOCUMENTS

| | | |
|---|---|---|
| 0133480 A2 | 2/1985 | (EP) . |
| 0430413 A3 | 10/1990 | (EP) . |
| 0449327 A2 | 3/1991 | (EP) . |
| 467 522 A2 | 1/1992 | (EP) . |
| 2679085 A1 | 6/1992 | (FR) . |
| 61-161027 | 7/1986 | (JP) . |
| 61-230430 | 10/1986 | (JP) . |
| 3-253123 | 11/1991 | (JP) . |

OTHER PUBLICATIONS

Joachim Hagenauer et al, "A Viterbi Algorithm with Soft–Decision Outputs and Its Applications", IEEE 1989, pp. 1680–1686.

Jan–Erik Stjernvall et al, "Radio Test Performance of a Narrowband TDMA System", IEEE 1987, pp. 293–299.

Gottfried Ungerboeck, "Adaptive Maximum–Likelihood Receiver for Carrier–Modulated Data–transmission Systems", IEEE Transactions on Communications, vol. COM–22, No. 5, May 1974, pp. 624–636.

\* cited by examiner

*Primary Examiner*—Emmanuel L. Moise
(74) *Attorney, Agent, or Firm*—Rabin & Champagne, P.C.

(57) ABSTRACT

A metric calculating means calculates a first metric corresponding to a transmitted symbol sequence estimated by an adaptive equalizer, then calculates a second metric corresponding to a symbol sequence in which a symbol located at a position where a soft decision is made in the transmitted symbol sequence is inverted in polarity. Thereafter a subtracting portion subtracts the second metric from the first metric. Further, a multiplying portion multiplies the subtraction result from the subtracting portion by the symbol located at a position where the soft decision is made in the transmitted symbol sequence to generate a soft decision.

21 Claims, 6 Drawing Sheets

SOFT DECISION ESTIMATION UNIT AND MAXIMUM-LIKELIHOOD SEQUENCE ESTIMATION UNIT

TECHNICAL FIELD

The present invention relates to a receiver for digital communication. More particularly, it relates to a soft decision estimation unit for soft decision of the output of an adaptive equalizer to carry out soft decision decoding by a channel decoder in a high-speed digital communication receiver having an adaptive equalizer and a channel decoder. It also relates to a maximum-likelihood sequence estimation unit for estimating transmitted symbols.

BACKGROUND TECHNOLOGY

Prior art relating to soft decision estimation units are, for example, reported in:

Citation 1: Joachim Hagenauer and Peter Hoeher, "A Viterbi algorithm with soft-decision outputs and its application", IEEE GLOBECOM'89

IEEE Cat. No. CH2682-March 1989, pp. 1680–1686, 1989

Citation 2: Jan-Eric Stjernvall, Bo Hedberg and Sven Ekenmark, "Radio test performance of a narrowband TDMA system", IEEE VTC'87, IEEE Cat. No. CH2429-September 1987, pp. 293–299, 1978.

Prior art relating to a maximum-likelihood sequence estimation unit is, for example, reported in:

Citation 3: Gottfried Ungerboeck, "Adaptive Maximum-Likelihood Receiver for Carrier Modulated Data-Transmission Systems", IEEE Transactions on Communications, Vol. COM-22, No. 5, pp. 624–636, May 1974.

In high-speed digital communication, the transmission path characteristic thereof largely fluctuates with time due to frequency selectivity fading caused by mutipath transmission. In order to correctly restore originally transmitted symbols from a received signal which has been affected by the fluctuation and noise, an adaptive equalizer is often used. As the adaptive equalizer of this kind, the maximum-likelihood-sequence estimation-type equalizer (referred to as an MLSE equalizer hereinafter) disclosed in the Citation 1 or a decision-feedback-type equalizer employed in the Citation 2 is often used. In the maximum-likelihood sequence estimation unit which employs the MLSE equalizer, a received and digitized signal is passed through a matched filter which minimizes the influence of noise by changing the characteristics thereof in accordance with the transmission path characteristic so that the most likely transmitted symbol sequence is estimated from the output of the matched filter. A viterbi algorithm is often used as the maximum-likelihood estimation algorithm in this case, as disclosed in the aforementioned Citation 3.

Moreover, in high-speed digital mobile communication, usually error-correction codes such as convolutional codes are used to reduce transmission data error. That is, in case the convolutional code is employed as the error-correction code, symbols formed by converting the transmission data into convolutional codes for transmission are modulated at the time of transmission and at the time of reception they are demodulated from the modulation frequency band to a base band and then are estimated by the adaptive equalizer. Thereafter the convolutional codes are decoded to restore the transmitted data.

A viterbi algorithm is usually used for decoding the convolutional codes. Decoding the convolutional codes with the Viterbi algorithm is largely divided into two kinds, i.e., hard decision type and soft decision type, of which the soft decision type has better performance. In order to perform the soft decision type decoding, the output of the adaptive equalizer that is the input of the convolutional code decoding portion must be a soft decision.

As described in Citation 1, in case where the MLSE equalizer is used as the adaptive equalizer, it is necessary to employ the soft decision output type Viterbi algorithm as the maximum-likelihood estimation algorithm of the transmitted symbols in order to make the output of the adaptive equalizer a soft decision. In the soft decision output type Viterbi algorithm, a quantity representing the certainty of its corresponding transmitted symbol (known as reliability) is updated every time a path representing the transmitted symbol is determined. Accordingly, it requires a reliability memory arranged in a matrix of number of states×number of transmitted symbols, similarly to a path memory.

On the other hand, in case the decision feedback type equalizer employed in Citation 2 is used as the adaptive equalizer receiver, it is possible to obtain a soft decision basically by generating a signal before it is provided to a decision unit in the adaptive equalizer.

In a conventional soft decision estimation unit, however, in a case where the MLSE equalizer is used as the adaptive equalizer, it requires the reliability memory to be arranged in a matrix of number of states×number of transmitted symbols, and particularly when the maximum multipath delay time to be taken into consideration becomes long, the number of states which the soft decision output type Viterbi algorithm handles increases exponentially so that the capacity of the reliability memory becomes bulky. Moreover, there was also a problem that the number of processes for calculating the reliability became bulky.

In case a decision feedback type equalizer is employed as the adaptive equalizer, a soft dcision corresponding to an estimated transmitted symbol does not simply correspond to each bit generally in a modulation system in which a symbol is represented by a plurality of bits such as QPSK and QAM, which are used in high-speed digital mobile communication. Particularly in the case where interleaving is achieved on the transmission side to deal with a burst error, deinterleaving must be achieved at the output of the adaptive equalizer, but it is difficult to do so with conventional soft decision processes.

DISCLOSURE OF THE INVENTION

Accordingly, the present invention has been made, taking into consideration the above problem a conventional soft decision estimation unit has in providing a soft decision estimation unit capable of estimating a soft decision using only a small memory capacity and a small number of processing steps, irrespective of the kind of adaptive equalizer used.

The present invention has been made also taking into consideration the above problem a conventional maximum-likelihood sequence estimation unit to has in providing a maximum-likelihood sequence estimation unit capable of producing a soft decision using only a small memory capacity and a small number of processing steps without largely deteriorating receiving performance.

BEST MODE FOR CARRYING OUT THE INVENTION

Figure 1:
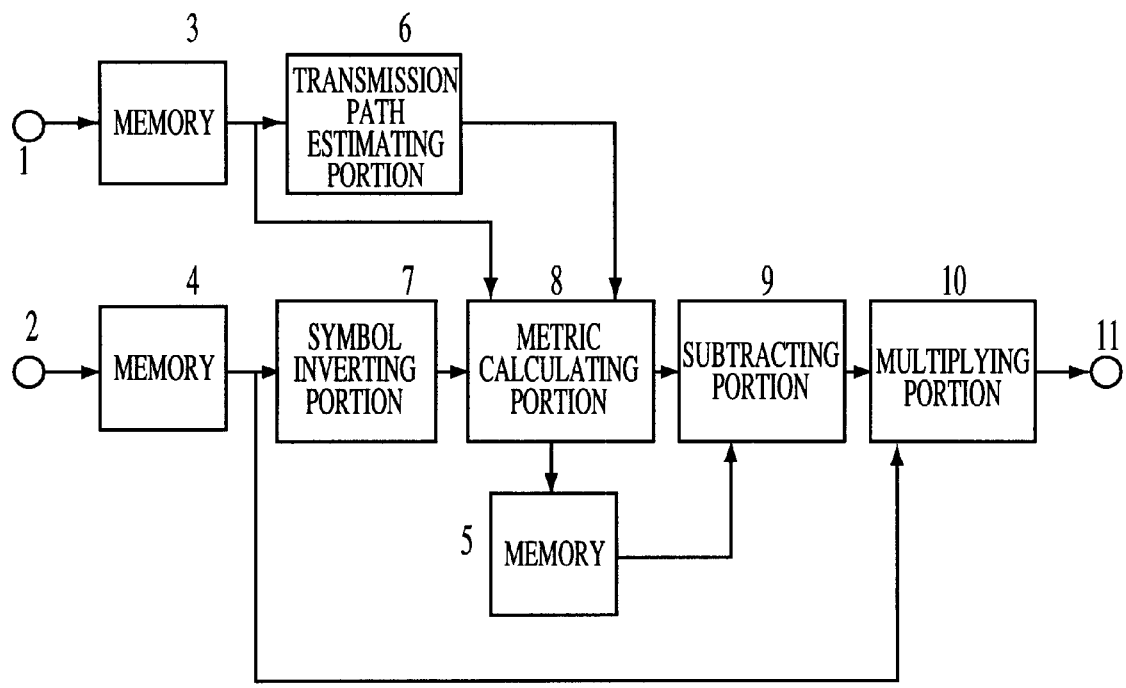
FIG. 1 is a block diagram of a soft decision estimation unit according to a first embodiment of the invention.

FIG. 1 is a block diagram of a soft decision estimation unit according to an embodiment of the invention. In FIG. 1, an input terminal 1 is connected to the input end of a memory 3 and the output end of the memory 3 is connected to the input end of a transmission path estimating portion 6 and an input end of a metric calculating portion 8. The output end of the transmission path estimating portion 6 is connected to another input end of the metric calculating portion 8.

On the other hand, an input terminal 2 is connected to the input end of a memory 4, and the output end of the memory 4 is connected to the input end of a symbol inverting portion 7. The output end of the symbol inverting portion 7 is connected to still another input end of the metric calculating portion 8 and the output end of the metric calculating portion 8 is connected to the input end of a memory 5 and the input end of a subtracting portion 9. The output end of the memory 5 is connected to the other input end of the subtracting portion 9. The output end of the subtracting portion 9 is connected to the input end of a multiplying portion 10, and the output end of the multiplying portion 10 is connected to an output terminal 11. The output end of the aforementioned memory 4 is further connected to the input end of the multiplying portion 10.

Figure 2:
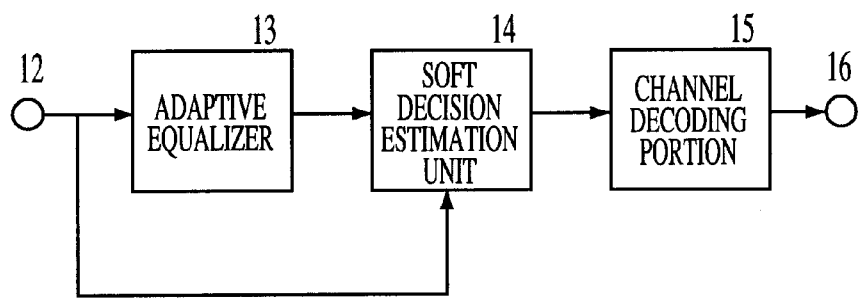
FIG. 2 is a block diagram showing an arrangement of a receiver employing the soft decision estimation unit.

FIG. 2 is a block diagram showing an arrangement of a receiver employing the soft decision estimation unit according to the invention.

In FIG. 2, an input terminal 12 is connected to the input ends of an adaptive equalizer 13 and a soft decision estimation unit 14. The output end of the adaptive equalizer 13 is also connected to another input end of the soft decision estimation unit 14. The output end of the soft decision estimation unit 14 is connected to the input end of a channel decoding portion 15 and the output end of the channel decoding portion 15 is connected to an output terminal 16.

The operation of the soft decision estimation unit according to the present invention will be described hereinafter in detail along the flow of signal with reference to FIGS. 1 and 2.

In FIG. 2, a signal received by the receiver is provided to the adaptive equalizer 13 by way of the input terminal 12. An antenna before the input terminal 12, and a frequency converter, a decoder, various filters and the like after the input terminal 12 are omitted from FIG. 2 since they have no direct relationship with the present invention. The adaptive equalizer 13 equalizes characteristics of the transmission path such as fading or multipath to estimate transmitted symbols. In order to apply the soft decision estimation method of the present invention to the adaptive equalizer 13, it can be of any kind so long as it subjects the transmitted symbols to a hard decision, so that various equalizers such as the MLSE equalizer or a decision feedback type equalizer can be used. Although it is a particular case, it is also enough to decide whether the transmitted symbol exceeds a threshold value or not without particularly equalizing the same. The output of the adaptive equalizer 13 is provided to the soft decision estimation unit 14.

Figure 3:
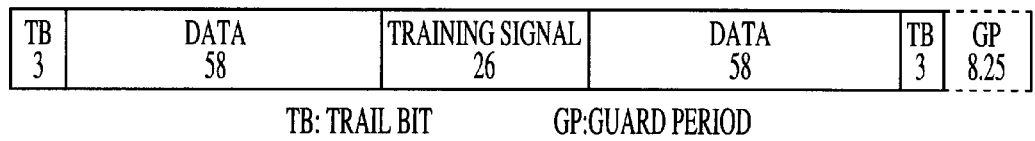
FIG. 3 is a schematic diagram showing an example of a burst signal employed in high-speed digital mobile communication.

In FIG. 1, the signal which is provided to the adaptive equalizer 13, i.e., a signal supplied from the input terminal 12, is provided to the input terminal 1 of the soft decision estimation unit 14 to be temporarily stored in the memory 3. A signal generated by the adaptive equalizer 13 is provided to the input terminal 2 of the soft decision estimation unit 14 to be temporarily stored in the memory 4. Although it is not particularly shown in FIGS. 1 and 2, the signals stored in the memories 3 and 4 are usually digitized. FIG. 3 shows a schematic arrangement of a burst signal employed in high-speed digital mobile communication, exemplifying a burst signal in the GSM system, which is a standard digital mobile communication system in Europe. The soft decision estimation unit 14 performs processing by the burst, so that each of the memories 3 and 4 stores therein a burst signal.

A signal stored in the memory 3 is supplied to the transmission path estimating portion 6 first to estimate the impulse response of the transmission path. Many methods can be conceived for the estimation; for example, incase of the GSM system employing the burst signal in FIG. 3, it is possible to comparatively easily perform the estimation using a training signal which is transmitted at about the central portion of the burst signal. That is, since the training signal is set to have an ideal impulse auto-correctional characteristic, if it is generated in the transmission path estimating portion 6, a cross-correlation between the generated training signal and a signal corresponding to the training signal portion of the burst signal from the memory 3 represents the impulse response of the transmission path to be estimated. Moreover, in the case where the adaptive equalizer 13 is an MLSE equalizer, since it has a transmission path estimating portion therein, the signal of the transmission path estimating portion in the adaptive equalizer 13 may be used without specially providing the transmission path estimating portion 6 in the soft decision estimation unit 14.

Then the signal stored in the memory 4 is supplied to the metric calculating portion 8 without being processed in the symbol inverting portion 7. This signal is a sequence obtained by subjecting the transmitted signals to hard decision estimation, and the metric calculating portion 8 calculates a metric for the transmitted symbols, which were estimated at the adaptive equalizer 13 and then transmitted therefrom, by a method to be described later. The metric is stored in a memory 5. In the case where the adaptive equalizer 13 is an MLSE equalizer, the metric is equal to the last metric in the adaptive equalizer 13, so that it can be directly supplied from the adaptive equalizer 13 too.

When the metric for the transmitted symbol sequence estimated by the adaptive equalizer 13 is stored in the memory 5, the symbol inverting portion 7 forms a symbol sequence by inverting the polarity of the first symbol of the transmitted symbol sequence stored in the memory 4 and supplies the same to the metric calculating portion 8. The metric calculating portion 8 calculated a metric for the symbol sequence and supplies the result of calculation to the subtracting portion 9. Then, in the subtracting portion 9, the metric supplied from the metric calculating portion 8 is subtracted from the metric (i.e., a metric which is equal to the last metric in the adaptive equalizer 13, in the case where the adaptive equalizer 13 is an MLSE equalizer) stored in the memory 5. The output of the subtracting portion 9 is multiplied in the multiplying portion 10 by the first symbol of the transmitted symbol sequence which was estimated by the adaptive equalizer 13 and is stored in the memory 4, and the result of multiplication is generated at the output terminal 11 as a first soft decision.

Then the symbol inverting portion 7 forms a symbol sequence by inverting the polarity of the second symbol of the transmitted symbol sequence stored in the memory 4 and supplies the same to the metric calculating portion 8. The metric calculating portion 8 calculates a metric for the symbol sequence in which the second symbol has been inverted in polarity, and supplies the metric to the subtracting portion 9. In the subtracting portion 9, the metric supplied from the metric calculating portion 8 is subtracted from the metric stored in the memory 5. The output of the subtracting portion 9 is multiplied in the multiplying portion 10 by the second symbol of the transmitted symbol sequence which is stored in the memory 4, and the result of multiplication is generated at the output terminal 11 as a second soft decision. Thereafter, the process is repeated similarly util a soft decision for the last symbol is obtained.

The metric calculating portion 8 needs the signal content of the memory 3 before it is provided to the adaptive equalizer 13 with the impulse response of the transmission path that is the output of the transmission path estimating portion 6 for calculating a metric as will be described later. Both inputs are supplied to the metric calculating portion 8, as illustrated in FIG. 1.

A sequence of soft decisions from the output terminal 11 of the soft decision estimation unit 14 is subjected to the soft decision decoding of the error correction codes in the channel decoding portion 15. At this time, for example in the case where the convolutional code is used for the error correction code, the soft decision type Viterbi algorithm can be used. Moreover, in the case where interleaving is achieved at the transmitting side, deinterleaving is also achieved in the channel decoding portion 15. The output data of the channel decoding portion 15 is generated at the output terminal 16.

The metric calculated in the metric calculating portion 8 will be described hereinafter in detail. Various metrics can be conceived for use in the metric calculating portion 8, but the most basic one is a mean square error. It is a mean square error between the expected signal provided to the adaptive equalizer 13 when a symbol sequence is transmitted (i.e., a signal obtained by calculating a convolution of the impulse response of the transmission path estimated by the transmission path estimating portion 6 and the symbol sequence which was used for calculating the metric) and a signal actually provided to the adaptive equalizer 13. It is given by the following expression.

$$M = \sum_k \frac{E_S}{NO} \left| y(k) - \sum_m h(m)x(k-m) \right|^2 \quad (1)$$

wherein y(k) is the input signal to the adaptive equalizer 13 which is stored i the memory 3, h(m) is the impulse response of the transmission path estimated by the transmission path estimating portion 6, x(k) is a symbol sequence assumed for obtaining the metric, and Es/NO is an instantaneous SNR.

The first Σ with respect to k means summing the length of the symbol sequence. This metric can be multiplied by a constant or a constant may be added thereto.

Figure 4:
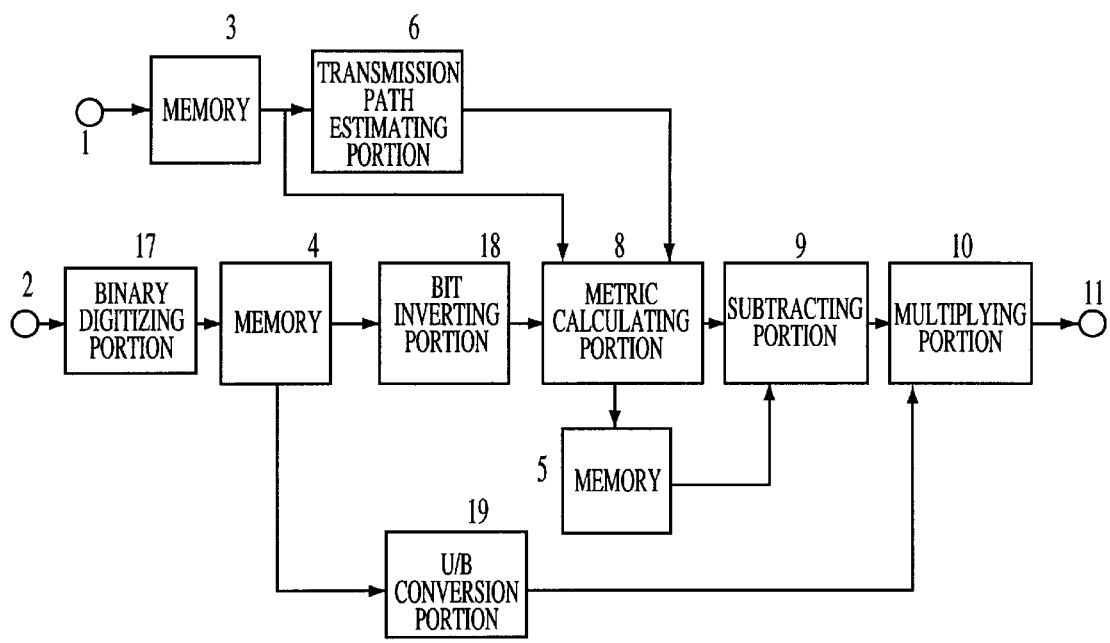
FIG. 4 is a block diagram of the soft decision estimation unit according to a second embodiment of the invention.

High-speed digital mobile communication often employs a modulation system such as QPSK or QAM in which a symbol is represented by a plurality of bits. FIG. 4 is a block diagram of a soft decision estimation unit according to the present invention which is applied to such a case. The same elements as those in FIG. 1 are denoted by the same numerals. In FIG. 4, the input terminal 1 is connected to the input end of the memory 3 while the output end of the memory 3 is connected to the input end of the transmission path estimating portion 6 and an input end of the metric calculating portion 8. The output end of the transmission path estimating portion 6 is also connected to another input end of the metric calculating portion 8.

Whereas the input terminal 2 is connected to the input end of a binary-digitizing portion 17, and the output end of the binary-digitizing portion 17 is connected to the input end of the memory 4. The output ends of the memory 4 are connected to the input ends of a bit inverting portion 18 and a unipolar/bipolar conversion portio 19 (referred to as a U/B conversion portion 19 hereinafter). The output end of the bit inverting portion 18 is connected to the still another input end of the metric calculating portion 8, and the output ends of the metric calculating portion 8 are connected to the input end of the memory 5 and an input end of the subtracting portion 9. The output end of the memory 5 is connected to the other input end of the subtracting portion 9. The output end of the subtracting portion 9 is connected to an input end of the multiplying portion 10. The other input end of the multiplying portion 10 is also connected to the output end of the aforementioned U/B conversion portion 19. The output end of the multiplying portion 10 is connected to the output terminal 11.

In FIG. 4, a signal which is provided to the adaptive equalizer 13, i.e., a signal input thereto from the input terminal 12 is supplied to the input terminal 1 and is temporarily stored in the memory 3. The transmission path estimating portion 6 estimates the impulse response of the transmission path from the input signal of the adaptive equalizer 13 supplied thereto and supplies the result of estimation to the metric calculating portion 8, similarly to the case shown in FIG. 1.

On the other hand, a sequence which is obtained by subjecting the transmitted symbols generated by the adaptive equalizer 13 to a hard decision is supplied to the input terminal 2. Each symbol of the transmitted symbol hard decision sequence is first converted into bits in the binary-digitizing portion 17. The output bit sequence is stored in the memory 4. Then, the bit sequence stored in the memory 4 is supplied to the metric calculating portion 8 without being processed in the bit inverting portion 18, and a metric is calculated in the metric calculating portion 8 by a method to be described later. The metric is stored in the memory 5.

When the metric corresponding to the bit sequence stored in the memory 4 is stored in the memory 5, the bit inverting portion 18 forms a bit sequence from that stored in the memory 4 by inverting the first bit thereof and supplies the same to the metric calculating portion 8. The metric calculating portion 8 calculates a metric corresponding to the bit sequence, and thereafter in the subtracting portion 9, the metric generated by the metric calculating portion 8 is subtracted from the metric stored in the memory 5. The output of the subtracting portion 9 is multiplied in the multiplying portion 10 by a value which is obtained by subjecting the first bit of the bit sequence stored in the memory 4 to (0,1)→(+1,−1) conversion in the U/B conversion portion. The result of multiplication is provided at the output terminal 11 as a first soft decision.

Thereafter in the bit inverting portion 18, a bit sequence is formed by inverting the second bit of the bit sequence stored in the memory 4 and is supplied to the metric calculating portion 8. The metric calculating portion 8 calculates a metric corresponding to the bit sequence in which the second bit is inverted. Then in the subtracting portion 9, the metric output from the metric calculating portion 8 is subtracted from the metric stored in the memory 5. The output of the subtracting portion 9 is multiplied in the multiplying portion 10 by a value which is obtained by subjecting the second bit of the bit sequence stored in the memory 4 to (0,1)→(+1,−1) conversion in the U/B conversion portion. The result of multiplication is provided at the output terminal 11 as a second soft decision. The processing is similarly performed until the last bit thereafter.

Various kinds of metrics to be used in the metric calculating portion 8 can be conceived similarly to the case shown in FIG. 1. That is, the metric used for FIG. 1 may be converted into a parameter which is related to the bit. In the case where a mean square error is used as the metric, it is possible to convert the bit sequence into a symbol sequence based on the modulation theory and calculate the metric using the expression (1).

Although FIGS. 1, 2, and 4 show functional blocks which constitute the invention, each being realized by individual hardware, it is also possible to separately represent their functions by software using DSP etc.

An embodiment wherein the soft decision estimation unit is applied to the maximum-likelihood sequence estimation unit will be described hereinafter.

Figure 5:
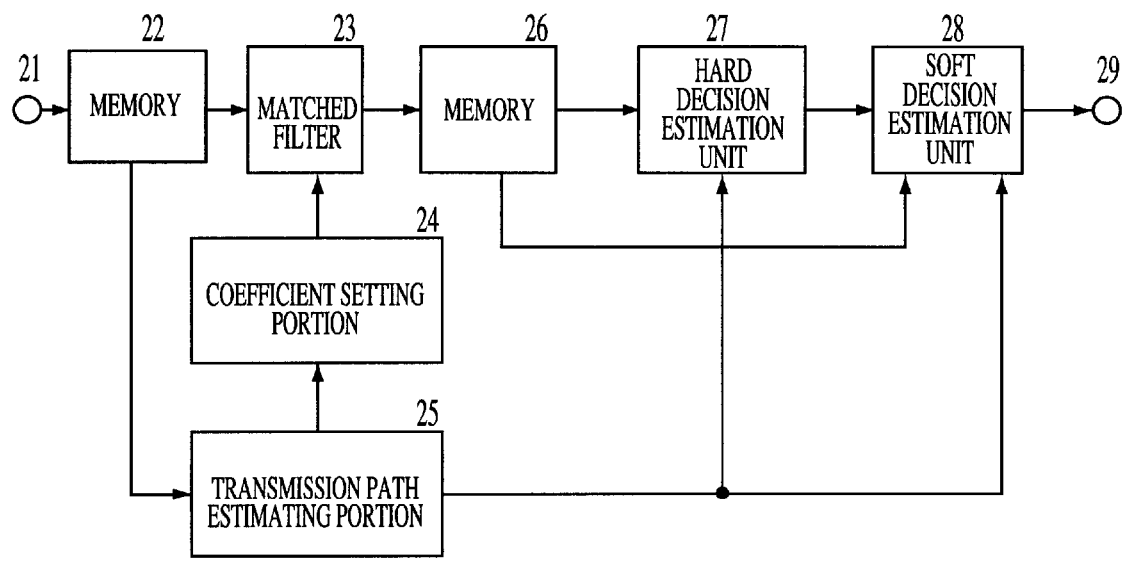
FIG. 5 is a block diagram of the maximum-likelihood sequence estimation unit according to an embodiment of the invention.

FIG. 5 is a block diagram of the maximum-likelihood sequence estimation unit according to an embodiment of the invention. In FIG. 5, an input terminal 21 is connected to the input end of a memory 22, and the output end of the memory 22 is connected to the input end of a transmission path estimating portion 25 and an input end of a matched filter 23. Further, the output end of the transmission path estimating portion 25 is connected to the input end of a coefficient setting portion 24, and the output end of the coefficient setting portion 24 is connected to the other input end of the matched filter 23. The output end of the matched filter 23 is connected to an input end of a memory 26, and the output end of the memory 26 is connected to an input end of a hard decision estimation unit 27. The output end of the aforementioned transmission path estimating portion 25 is also connected to the other input end of the hard decision estimation unit 27. The output end of the hard decision estimation unit 27 is connected to the input end of a soft decision estimation unit 28, and further the output ends of the transmission path estimating portion 25 and the memory 26 are connected to input ends of the soft decision estimation unit 28. The output end of the soft decision estimation unit 28 is connected to an output terminal 29.

Figure 6:
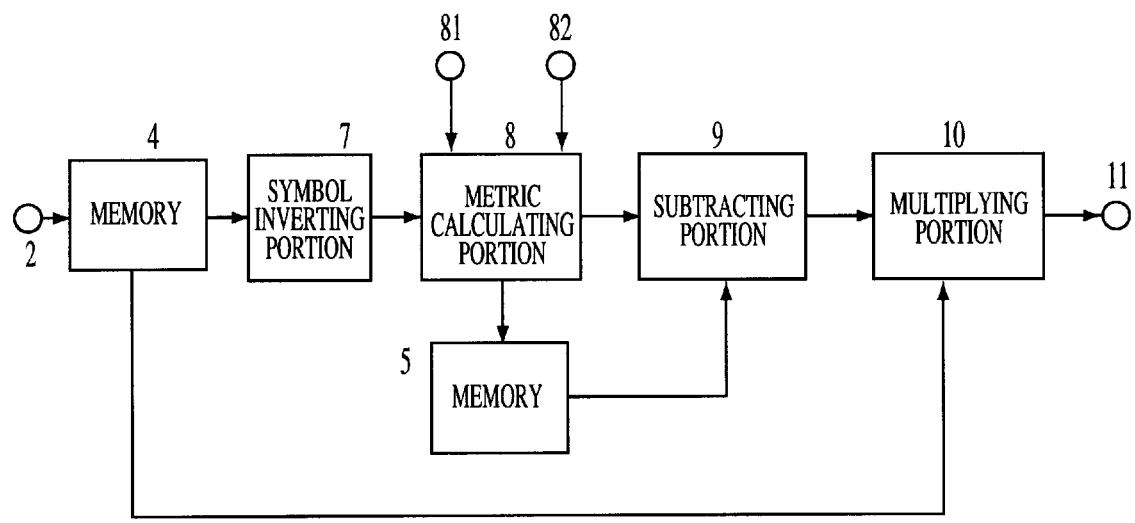
FIG. 6 is a block diagram of a soft decision estimation unit used in the maximum-likelihood sequence estimation unit according to the first embodiment of the invention.

FIG. 6 is a block diagram of the soft decision estimation unit 28 which is used in the maximum-likelihood sequence estimation unit. The same elements as those in FIG. 1 are denoted by the same numerals. In FIG. 6, the input terminal 2 is connected to the input end of the memory 4. The output end of the memory 4 is connected to the input end of the symbol inverting portion 7, and the output end of the symbol inverting portion 7 is connected to an input end of the metric calculating portion 8. Further, the output ends of the transmission path estimating portion 25 and the memory 26 illustrated in FIG. 5 are connected to the input ends of the metric calculating portion 8 by way of input terminals 14 and 15, respectively. The output end of the metric calculating portion 8 is connected to the input ends of the memory 5 and the subtracting portion 9. The output end of the memory 5 is connected to the other input end of the subtracting portion 9. The output end of the subtracting portion 9 is connected to an input end of the multiplying portion 10, and the output end of the memory 4 is further connected to the other input end of the multiplying portion 10. The output end of the multiplying portion 10 is connected to the output terminal 11.

Figure 7:
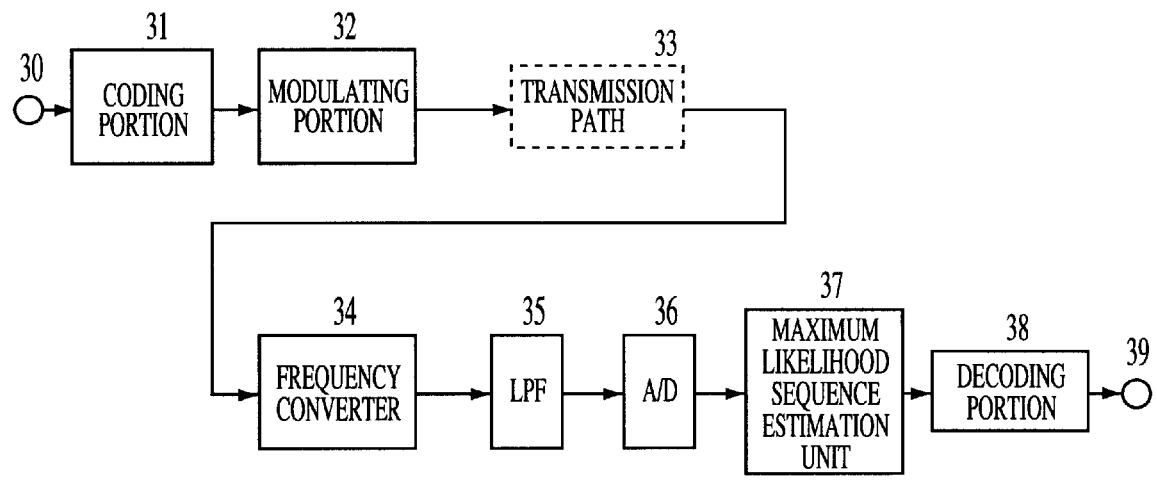
FIG. 7 is a block diagram showing an arrangement of a transmit/receive system for high-speed digital mobile communication employing the maximum-likelihood sequence estimation unit.

FIG. 7 is a block diagram showing an arrangement of a transmit/receive system for high-speed digital mobile communication which employs the maximum-likelihood sequence estimation unit of the invention. In FIG. 7, a transmission data input terminal 30 is connected to a coding portion 31. The output end of the coding portion 31 is connected to the input end of a modulating portion 32, and the output end of the modulating portion 32 is connected to the input end of a frequency converter 34 by way of a transmission path 33. The output end of the frequency converter 34 is connected to the input end of a low-pass filter (abbreviated as an LPF hereinafter) 35, and the output end of the LPF 35 is connected to the input end of an A/D converter 36. The output end of the A/D converter 36 is connected to the input end of a maximum-likelihood sequence estimation unit 37, and the output end of the maximum-likelihood sequence estimation unit 37 is connected to the input end of a decoding portion 38. The output end of the decoding portion 38 is connected to a data output terminal 39. The maximum-likelihood sequence estimation unit 37 in FIG. 7 corresponds to the whole block diagram of FIG. 5.

The maximum-likelihood sequence estimation unit according to the invention will be described in detail along the flow of signal with reference to FIGS. 5 through 7. When data is supplied from the transmission data input terminal 30 to the coding portion 31 shown in FIG. 7, an error correction coding is performed using, for example, convolutional codes. The output of the coding portion 31 is modulated in the modulating portion 32 into a radio frequency band to be emitted as an electrical wave.

The electrical wave spreads in space to reach a receiver. In FIG. 7, the space is represented by the transmission path 33. The signal received by the receiver is converted in frequency by the frequency converter 34 into a base-band signal by way of synchronous detection etc. At this time, if the modulating portion 32 employs a modulating system of orthogonal modulation type such as QPSK or MSK, it produces two outputs, i.e., the in-phase component and the quadrature phase component. In this case, each signal processed after the frequency converter 34 has two components of the in-phase and the quadrature phase. The signal generated by the frequency converter 34 is rid of noises which lie outside a desired frequency band in the LPF 35, and is converted into a digital signal in the A/D converter 36. The digital signal generated by the A/D converter 36 is supplied to the maximum-likelihood sequence estimation unit 37.

The maximum-likelihood sequence estimation unit 37 will be described further in detail hereinafter. The digital signal supplied to the maximum-likelihood sequence estimation unit 37 is temporarily stored in the memory 22 by way of the input terminal 21 as shown in FIG. 5. In high-speed digital mobile communication, signals are generally transmitted in the form of bursts. Since the maximum-likelihood sequence estimation unit 37 processes the signal on a burst-by-burst basis, a burst of signal is stored in the memory 22.

The signal stored in the memory 22 is first provided to the transmission path estimating portion 25, where the impulse response of the transmission path is estimated. Various methods of estimation can be conceived. For example, in case of a GSM system using a burst as shown in FIG. 3, it is possible to estimate comparatively easily using a training signal which is transmitted around halfway through the burst. That is, since the training signal is designed to have an ideal impulse autocorrelation characteristic, when the transmission path estimating portion 25 generates the training signal to get the correlation between the training signal and a signal corresponding thereto in the burst from the memory 22, it represents the impulse response of the transmission path to be estimated.

Figure 8:
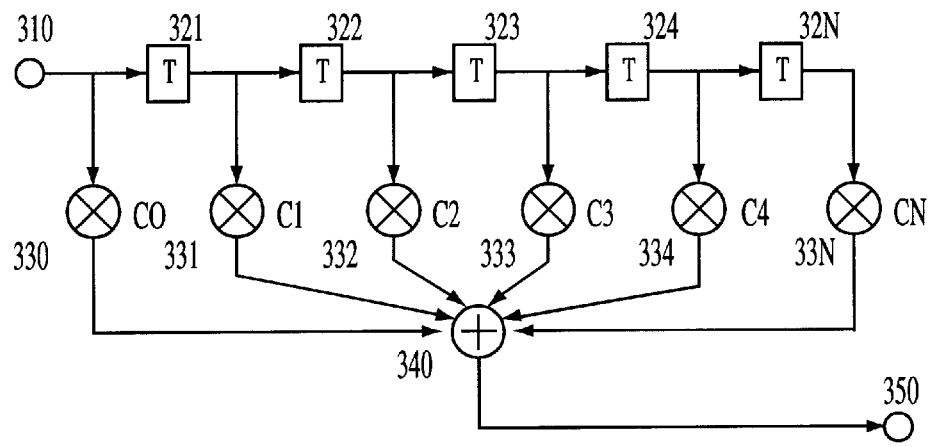
FIG. 8 is a block diagram of a matched filter.

The signal stored in the memory 22 is also supplied to the matched filter 23. FIG. 8 is a block diagram showing an arrangement of the matched filter 23. FIG. 8 shows a so-called transversal-type digital filter in which the order number N is 5. A digital signal received at an input terminal 310 successively passes through delay portions 321, 322, ..., 32N, each having a delay time which is equal to the sampling time T of the digital signal. At those times, signals output received at the input terminal 310 and the delay portions 321, 322, ..., 32N are multiplied by tap coefficients C0, C1, ..., CN in multiplying portions 330, 331, ..., 33N respectively. Signals generated by the multiplying portions 330, 331, ..., 33N are totaled in an adding portion 340, to be provided at an output terminal 350. In the case of an orthogonal modulation type, however, a signal is usually represented by a complex number composed of a real part of the in-phase component and an imaginary part of the quadrature component for convenience. Therefore, in this case, the tap coefficients C0, C1, ..., CN are complex numbers. The tap coefficients C0, C1, ..., CN need to be set to the time-reversal complex conjugates of the impulse responses of the transmission path in order to function as matched filters to minimize the influence of noise.

The aforementioned setting is performed by the coefficient setting portion 24 which calculates the time-reversal complex conjugates of the impulse responses of the transmission path generated by the transmission path estimating portion 25, and the time-reversal complex conjugates are supplied to the matched filter 23 as tap coefficients.

A signal generated by the matched filter 23 is temporarily stored in the memory 26. The signal stored in the memory 26 is supplied to the hard decision estimation unit 27 first, where it is subjected to the maximum-likelihood estimation of transmitted symbol sequence using a maximum-likelihood estimation algorithm. In this case, for example, the Viterbi algorithm disclosed in the Citation 1 can be employed as the maximum-likelihood estimation algorithm. The Viterbi algorithm successively selects and determines most likely transmitted symbols using an estimated amount called metric, described later in more detail. Calculating the metric requires the impulse response of the transmission path obtained by the transmission path estimating portion 25. The signal generated by the hard decision estimation unit 27 is supplied to the soft decision estimation unit 28, in which a soft decision is calculated.

Calculating the soft decision will be described in more detail hereinafter. The signal provided to the soft decision estimation unit 28 is temporarily stored in the memory 4 by way of the input terminal 2, as shown in FIG. 6. The signal stored in the memory 4, i.e., that received at the input terminal 2, is the hard decision of a transmitted symbol sequence estimated by the hard decision estimation unit 27 (estimated transmitted symbol sequence), and it is supplied first to the metric calculating portion 8 without being processed in the symbol inverting portion 7. In the metric calculating portion 8, a metric corresponding to the input estimated transmitted symbol sequence is calculated. The metric corresponding to the estimated transmitted symbol is, however, equal to the last metric in the hard decision estimation unit 27 so that it can also be directly supplied from the hard decision estimation unit 27. The metric which is equal to the last metric calculated in the metric calculating portion 8 is stored in the memory 5.

Then the symbol inverting portion 7 forms a symbol sequence by inverting the polarity of the first symbol of the transmitted symbol sequence stored in the memory 4 and supplies the same to the metric calculating portion 8. The metric calculating portion 8 calculates a metric corresponding to the symbol sequence in which the first symbol is inverted in polarity. Thereafter the metric stored in the memory 5 is supplied to the subtracting portion 9 and at the same time the metric calculated by the metric calculating portion 8 is also supplied to the subtracting portion 9. In the subtracting portion 9, the metric generated by the metric calculating portion 8 is subtracted from the metric stored in the memory 5 (i.e., the metric which is equal to the last metric in the hard decision estimation unit 27). Then the output of the subtracting portion 9 is multiplied in the multiplying portion 10 by the first symbol of the estimated transmitted symbol sequence stored in the memory 4, and the result of the multiplication is provided at the output terminal 11 as a first soft decision.

Thereafter the symbol inverting portion 7 forms a symbol sequence by inverting the polarity of the second symbol of the estimated transmitted symbol sequence stored in the memory 4 and supplies the same to the metric calculating portion 8. The metric calculating portion 8 calculates a metric corresponding to the symbol sequence in which the second symbol is inverted in polarity. Then in the subtracting portion 9, the metric generated by the metric calculating portion 8 is subtracted from the metric stored in the memory 5. The output of the subtracting portion 9 is multiplied in the multiplying portion 10 by the second symbol of the estimated transmitted symbol sequence stored in the memory 4 and the result of multiplication is provided at the output terminal 11 as a second soft decision. Successively, similar processing is performed until a soft decision corresponding to the last symbol is obtained.

The metric calculating portion 8 requires the content of the memory 26 that is the output of the matched filter 23 and the impulse response of the transmission path that is the output of the transmission path estimating portion 25 in order to calculate the metrics described above. The content of the memory 26 and the impulse response of the transmission path are supplied to the metric calculating portion 8 by way of the input terminals 14 and 15 respectively. A soft decision sequence provided at the output terminal 29 of the maximum-likelihood sequence estimation unit 37 is supplied to the decoding portion 38 to be subjected to the soft decision decoding of the error correcting codes. It can be performed by using a soft decision type Viterbi algorithm in the case where the convolutional codes are used as the error correcting codes. Data generated by decoding portion 38 are provided at the decoded data output terminal 39.

Various kinds of metrics can be conceived as those for use in the maximum-likelihood estimation algorithm of the hard decision estimation unit 27 or in the metric calculating portion 8 of the soft decision estimation unit 28, but the most basic one is the mean square error. It is a mean square error between a signal actually provided to the matched filter 23 and a signal obtained by the convolutional integration of the impulse response of the transmission path estimated by the transmission path estimating portion 25 and the symbol sequence which was used for calculating the metric. It can be expressed as follows.

$$M = \sum_k \frac{E_S}{N0} \left| y(k) - \sum_m h(m)x(k-m) \right|^2 \quad (1a)$$

wherein y(k) is a signal provided to the matched filter 23, i.e., the signal provided to the maximum-likelihood sequence estimation unit 37 and stored in the memory 22, h(m) is the impulse response of the transmission path estimated by the transmission path estimating portion 25, x(k) is a symbol sequence used for calculating the metric and Es/N0 is an instant SNR. The first $\Sigma$ with respect to k of the expression (1a) means summing the following terms the length of the symbol sequence while the latter $\Sigma$ with respect to m means summing so long as the impulse response of the transmission path h(m) has a value.

Although the expression (1a) represents a most basic metric, since the matched filter 23 minimizes the influence of noise as described above, it is preferable to estimate the signal generally after the matched filter 23 rather than before the same. Accordingly, if a mean square error between the output signal of the matched filter 23 expected at the time of transmitting the symbol sequence and an actual output signal of the matched filter 23 is employed as a metric, it can be expressed as follows.

$$M = \sum_k \left| z(k) - \sum_m s(m)x(k-m) \right|^2 \quad (2)$$

wherein z(k) is a signal generated by the matched filter 23. s(m), which represents a response when the impulse response signal of the transmission path h(m) estimated by the transmission path estimating portion 25 passes through the matched filter 23, can be expressed as follows:

$$s(m) = \sum_n g(n)h(m-n) \quad (3)$$

wherein g(m) is the transfer function of the matched filter 23. Since the transfer function g(m) of the matched filter 23 is the time-reversal complex conjugate of the impulse response h(m) of the transmission path, s(m) represents the autocorrelation of the impulse response of the transmission path. In the expression (2), the first $\Sigma$ with respect to k means summing the length of the symbol sequence, while the latter $\Sigma$ with respect to m means summing the following terms so long as the autocorrelation s(m) of impulse response of the transmission path has a value, and in the expression (3), the $\Sigma$ with respect to n means summing the number of taps of the matched filter 23. This metric may be multiplied by a constant or a constant may be added thereto.

Mean square errors represented by the above expressions (1a) and (2) are basic metrics, but they require complicated calculations, so that a quantity given by the following expression (4) which is a modification of the expressions (1a) and (2) is often used as the metric as described in the Citation 1.

$$M = \sum_n 2Re[x(n)^*z(n)] - \sum_n \left[ \sum_i x(i)^* h(n-1) \right]\left[ \sum_k x(k)^* h(n-k) \right] \quad (4)$$

wherein Re [ ] means the real portion of the content inside [ ] and * means the complex conjugate. $\Sigma$ with respect to n represents summing the length of the assumed symbol sequence, while $\Sigma$s with respect to i and k represent summing the length of the impulse response of the transmission path. The expression (4) means subtracting the autocorrelation of cross-correlation between the symbol sequence and the impulse response of the transmission path from twice the real portion of the cross-correlation between the symbol sequence and the output of the matched filter 23. The expression (4) can be also modified as follows:

$$M = \sum 2Re[x(n)^* z(n)] - \sum_i \sum_k x(i)^* s(i-k)x(k) \quad (5)$$

The expression may be multiplied by a constant or a constant may be added to the expression.

Carrying out the processing of the soft decision estimation unit 28 as shown in FIG. 6 using the metric given by the expression (5) is equivalent to calculating the following expression.

$$L(n) = 4Re\left[ x(n)^* \left( z(n) - \sum_k s(n-k)x(k) \right) \right] \quad (6)$$

wherein $\Sigma$ with respect to k means summing so long as the autocorrelation s(n−k) of impulse response of the transmission path has a value and k=n is not established. Accordingly, the soft decision estimation unit 28 may also calculate the expression (6).

Figure 9:
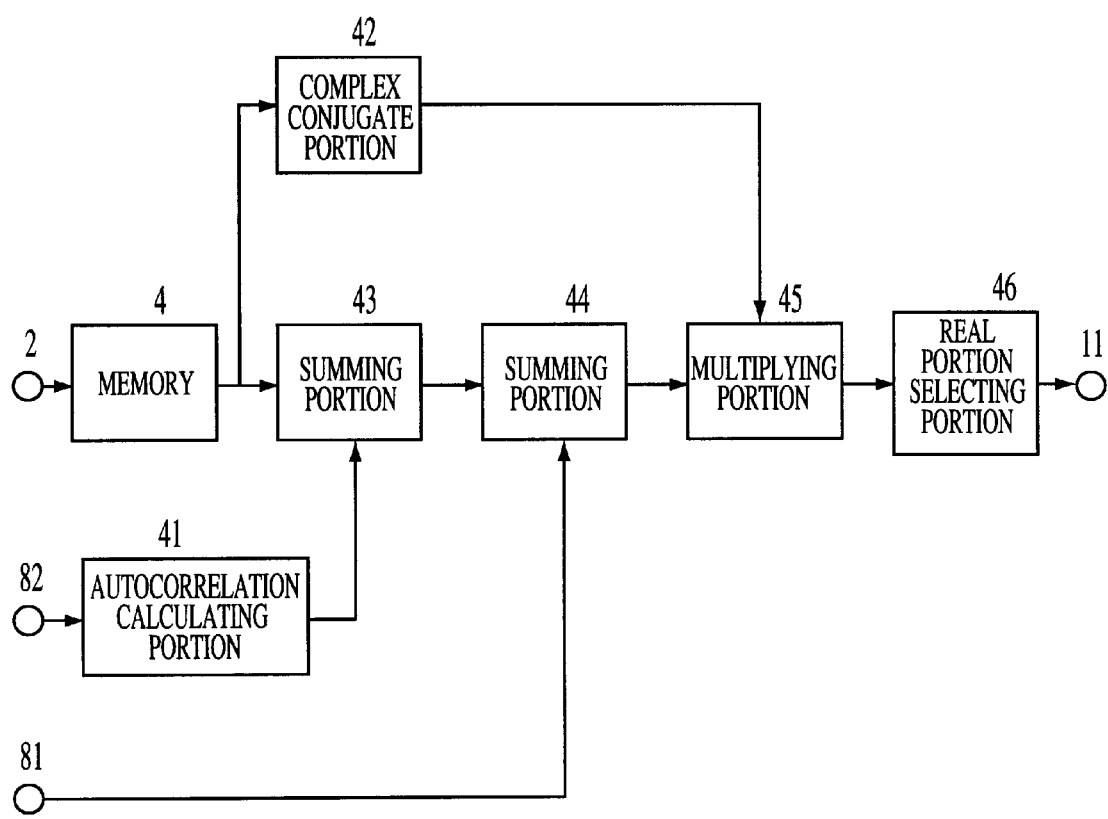
FIG. 9 is a block diagram of the soft decision estimation unit used in the maximum-likelihood sequence estimation unit according to the second embodiment of the invention.

FIG. 9 is a block diagram of the soft decision estimation unit 28 which is used in the maximum-likelihood sequence estimation unit according to another embodiment of the present invention and which uses the aforementioned expression (6) in particular. The same elements as those in FIG. 6 are denoted by the same numerals. In FIG. 9, a symbol sequence generated by the hard decision estimation unit 27 is supplied to the input terminal 2. The symbol sequence supplied to the input terminal 2 is temporarily stored in the memory 4 as it is. The impulse response of the transmission path is received from the transmission path estimating portion 25 at an input terminal 15. Thereafter, an autocorrelation calculating portion 41 calculates the auto-correlation (expression (3)) of impulse response of the transmission path received at the input terminal 15.

Upon completion of the calculation, a summing portion 43 performs multiplying and summing operations, aligning the first symbol of the symbol sequence stored in the memory 4 with the time origin of the autocorrelation function generated by the autocorrelation calculating portion 41. In concrete, the operation to be related to the $\Sigma$ in the expression (6) is performed. The output of the summing portion 43 is supplied to a subtracting portion 44. The subtracting portion 44 is connected to an input terminal 14, through which the first output of the matched filter 23 is supplied to the subtracting portion 44. Then the subtracting portion 44 subtracts the output of the summing portion 43 from the first output of the matched filter 23. The subtracting portion 44 supplies the result of subtraction to a multiplying portion 45.

Thereafter a complex conjugate portion 42 supplies the complex conjugate of the first symbol read out from the aforementioned memory 4 to the multiplying portion 45, which multiplies the output of the complex conjugate portion 42 and that of the subtracting portion 44 together to supply the result of multiplication to a real portion selecting portion 46. The real portion selecting portion 46 selectively generates real numbers only, from the multiplication result of the multiplying portion 45. The output of the real portion selecting portion 46 is provided at the output terminal 11 as a first soft decision. Thereafter the second symbol of the symbol sequence stored in the memory 4 is subjected to similar processing to be provided at the output terminal 11 as a second soft decision and similarly the following symbols are processed until the last symbol. Multiplying by a constant 4 as represented in the expression (6) may be performed by the multiplying portion 45 or may be omitted.

In case the transmission path changes rapidly in time relative to the length of the transmitted burst, the impulse response of the transmission path estimated by the transmission path estimating portion 25 cannot be regarded to be constant. In this case, the processing of the matched filter 23 may deteriorate performance instead of improving it. In this case, the matched filter 23 had better do nothing or the output of the memory 22 in FIG. 5 had better be supplied to the hard decision estimation unit 27 as it is. Also in this case, calculating the soft decision which is the feature of the invention is effective. But in case the output of the memory 22 is provided to the hard decision estimation unit 27 as it is, the output of the memory 22 is supplied to the soft decision estimation unit 28 also.

Figure 10:
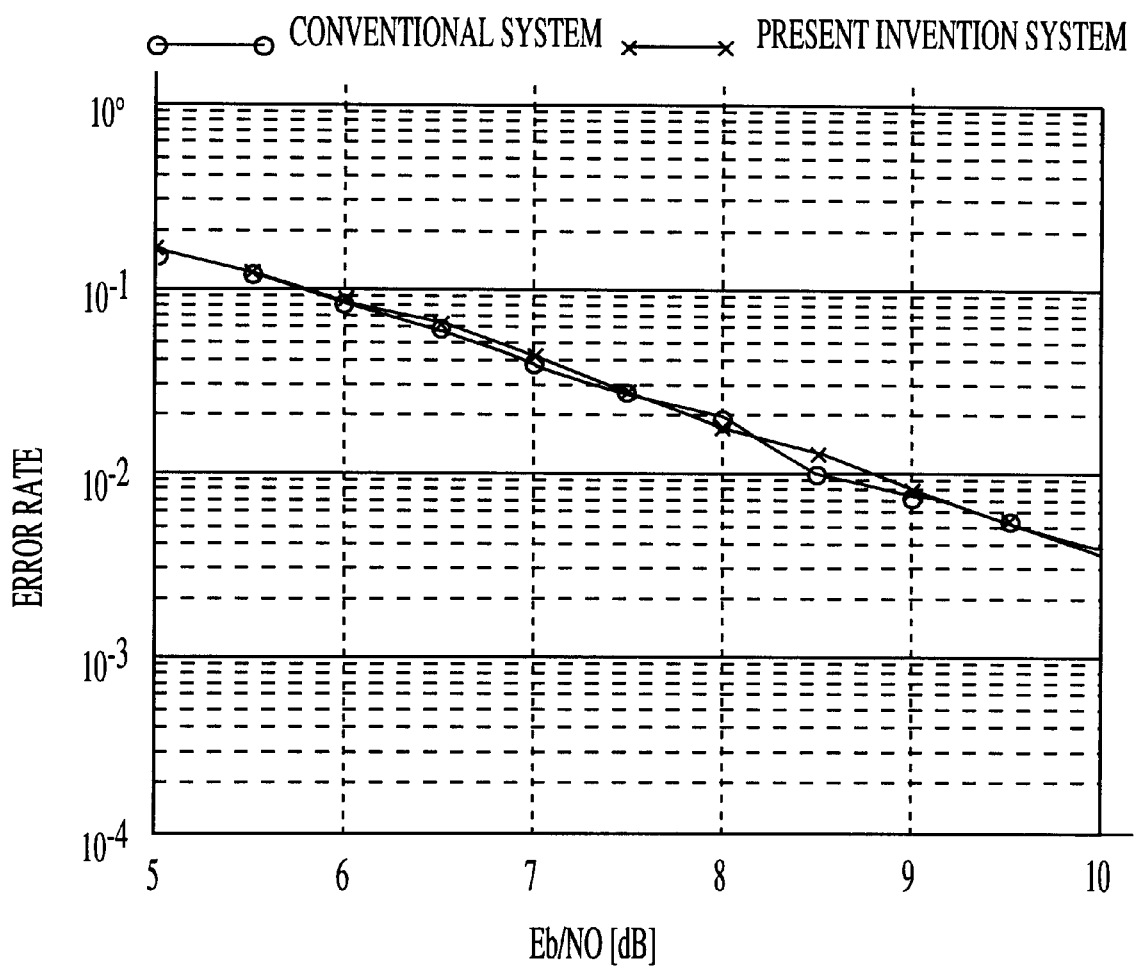
FIG. 10 is a graph showing a computer simulation result of the maximum-likelihood sequence estimation unit according to the invention.

Although the functions constituting the invention are represented by blocks, each of which is realized by individual hardware as described above with reference to FIGS. 5, 6, 7, 8, and 9, it also possible to separately realize the individual functions by software using DSP etc. FIG. 10 is a graph exemplifying a computer simulation result of the maximum-likelihood sequence estimation unit according to the invention. The abscissa axis represents a ratio of signal power and noise power density per bit Eb/NO and the ordinate axis represents a bit error rate. Moreover, this case premises the condition of the GSM system. FIG. 10 shows that the maximum-likelihood sequence estimation unit of the invention has approximately the same performance as a conventional one using a soft decision output type Viterbi algorithm.

INDUSTRIAL UTILIZATION

As described above, according to the invention, it is possible to estimate a soft decision from a transmitted symbol sequence or transmitted bit sequence which consists of hard decision outputs from an adaptive equalizer. As a result, it is possible to provide a soft decision estimation unit for estimating a soft decision with a small memory and a little amount of processing irrespective of the kind of the adaptive equalizer used.

Moreover, the maximum-likelihood sequence estimation unit of the invention can calculate a soft decision sequence after estimating a hard decision sequence without using the soft decision output type Viterbi algorithm. Furthermore, since this calculation is performed based on the hard decision sequence, the output of a matched filter, and the impulse response of a transmission path, the maximum-likelihood sequence estimation unit does not reed a reliability memory, so that it can generate a soft decision with a small memory and a little amount of processing.

We claim:

1. A soft decision estimation unit, comprising:
    first metric calculating means for calculating a metric corresponding to a transmitted symbol sequence estimated by an adaptive equalizer;
    second metric calculating means for generating a symbol sequence which is generated by inverting in polarity a symbol of said transmitted symbol sequence, said symbol being located at a position where a soft decision is made, and calculating a metric corresponding to said generated symbol sequence;
    subtracting means for subtracting a metric obtained by said second metric calculating means from that obtained by said first metric calculating means; and
    multiplying means for multiplying an output of said subtracting means by a symbol located at a position where a soft decision is made in said transmitted symbol sequence.

2. A soft decision estimation unit according to claim 1, wherein at least one of said metric obtained by the first metric calculating means and said metric obtained by the second metric calculating means is equivalent to a mean square error between a signal obtained by calculating a convolution of an impulse response of a transmission path and said symbol sequence used for said metric calculation, or is equivalent to said mean square error multiplied by a constant or said mean square error to which a constant is added.

3. A soft decision estimation unit, comprising:
    symbol inverting means for generating a symbol sequence by inverting in polarity a symbol located at a position where a soft decision is made in a transmitted symbol sequence;
    metric calculating means for successively calculating a first metric corresponding to said transmitted symbol sequence estimated by an adaptive equalizer and a second metric corresponding to said symbol sequence generated by inverting in polarity said symbol located at a position where a soft decision is made in said transmitted symbol sequence;
    subtracting means for subtracting said second metric from said first metric to provide an output; and
    multiplying means for multiplying said output of said subtracting means by a symbol located at a position where a soft decision is made in said transmitted symbol sequence.

4. A soft decision estimation unit according to claim 3, wherein at least one of said first metric and said second metric is equivalent to a mean square error between a signal obtained by calculating a convolution of an impulse response of a transmission path and said symbol sequence used by said metric calculating means for calculating the first metric and the second metric, or is equivalent to said mean square error multiplied by a constant or said mean square error to which a constant is added.

5. A soft decision estimation unit, comprising:
    binary-digitizing means for converting a transmitted symbol estimated by an adaptive equalizer into a transmitted bit sequence in accordance with a modulation system;
    first metric calculating means for calculating a metric corresponding to said transmitted bit sequence obtained by said binary digitizing means;
    second metric calculating means for generating a bit sequence in which a bit located at a position where a soft decision is made in said transmitted bit sequence is inverted in polarity and for calculating a metric corresponding to said generated bit sequence;
    subtracting means for subtracting a metric obtained by said second metric calculating means from a metric obtained by said first metric calculating means;
    unipolar/bipolar converting means for converting a bit located at a position where a soft decision is made in said bit sequence into a bipolar value of +1; and
    multiplying means for multiplying an output of said unipolar/bipolar converting means by that of said subtracting means.

6. A soft decision estimation unit, comprising:
    binary-digitizing means for converting a transmitted symbol estimated by an adaptive equalizer into a transmitted bit sequence in accordance with a modulation system;
    bit inverting means for generating a bit sequence in which a bit located at a position where a soft decision is made in said transmitted bit sequence is inverted in polarity;

metric calculating means for calculating a first metric corresponding to a transmitted bit sequence obtained by said binary-digitizing means and a second metric corresponding to said bit sequence obtained by said bit inverting means;

subtracting means for subtracting said second metric from said first metric;

unipolar/bipolar converting means for converting a bit located at a position where a soft decision is made in said bit sequence into a bipolar value of +1; and multiplying means for multiplying an output of said unipolar/bipolar converting means by that of said subtracting means.

7. A maximum-likelihood sequence estimation unit, comprising:

transmission path estimating means for estimating an impulse response of a transmission path from an input signal;

matched filter means for minimizing an influence of noise in said input signal by way of tap coefficients based on said impulse response of said transmission path;

hard decision estimating means for estimating a maximum-likelihood transmitted symbol sequence based on an output of said matched filter means using said impulse response of said transmission path; and soft decision calculating means for calculating a soft decision based on an output of said hard decision estimating means using the output of said matched filter means and said impulse response of said transmission path.

8. A maximum-likelihood sequence estimation unit according to claim 7, wherein said soft decision calculating means comprises:

first metric calculating means for calculating a metric corresponding to an estimated transmitted symbol sequence output from said hard decision estimating means;

second metric calculating means for generating a symbol sequence in which a symbol located at a position where a soft decision is made in said estimated transmitted symbol sequence is inverted in polarity and for calculating a metric corresponding to said generated symbol sequence;

subtracting means for subtracting a metric obtained by said second metric calculating means from said metric obtained by said first metric calculating means; and multiplying means for multiplying an output of said subtracting means by a symbol located at a position where a soft decision is made in said estimated transmitted symbol sequence.

9. A maximum-likelihood sequence estimation unit according to claim 8, wherein at least one of said metric obtained by the first metric calculating means and said metric obtained by the second metric calculating means is a mean square error between a convolutional integral of said impulse response of a transmission path and said symbol sequence used for calculating a metric; said convolutional integral having been passed through a matched filter, and an output of said matched filter means, or said at least one of said metric obtained by the first metric calculating means and said metric obtained by the second metric calculating means is said mean square error which is multiplied by a constant or to which a constant is added.

10. A maximum-likelihood sequence estimation unit according to claim 8, wherein at least one of said metric obtained by the first metric calculating means and said metric obtained by the second metric calculating means is a value obtained by subtracting an autocorrelation of a cross-correlation between said symbol sequence used for calculating said metric and said impulse response of a transmission path from a value obtained by doubling the real portion of cross-correlation between a symbol sequence estimated by said hard decision estimating means and the output of said matched filter means, or said at least one of said metric obtained by the first metric calculating means and said metric obtained by the second metric calculating means is said calculated value which is multiplied by a constant or to which a constant is added.

11. A maximum-likelihood sequence estimation unit according to claim 7, wherein said soft decision calculating means comprises:

symbol inverting means for generating a symbol sequence in which a symbol located at a position where a soft decision is made in an estimated transmitted symbol sequence output from said hard decision estimating means is inverted in polarity;

metric calculating means for successively calculating a first metric corresponding to an estimated transmitted symbol sequence output from said hard decision estimating means and a second metric corresponding to said symbol sequence output from said symbol inverting means;

subtracting means for subtracting said second metric from said first metric; and multiplying means for multiplying an output of said subtracting means by a symbol located at a position where a soft decision is made in said transmitted symbol sequence.

12. A maximum-likelihood sequence estimation unit according to claim 11, wherein at least one of said first metric and said second metric is a mean square error between a convolutional integral of said impulse response of a transmission path and said symbol sequence used for calculating a metric, said convolutional integral having been passed through a matched filter, and an output of said matched filter means, or said at least one of said first metric and said second metric is said mean square error which is multiplied by a constant or to which a constant is added.

13. A maximum-likelihood sequence estimation unit according to claim 11, wherein at least one of said first metric and said second metric is a value obtained by subtracting an autocorrelation of a cross-correlation between said symbol sequence used for calculating said at least one of said first metric and said second metric and said impulse response of a transmission path from a value obtained by doubling the real portion of cross-correlation between a symbol sequence estimated by said hard decision estimating means and the output of said matched filter means, or said at least one of said first metric and said second metric is said calculated value which is multiplied by a constant or to which a constant is added.

14. A maximum-likelihood sequence estimation unit according to claim 7, wherein said soft decision calculating means comprises:

autocorrelation calculating means for calculating an autocorrelation of said impulse response of said transmission path;

summing means for performing multiplying and summing operation aligning a symbol located at a position where a soft decision is made in a transmitted symbol sequence estimated by said hard decision estimating means with a time origin of said autocorrelation calculated by said autocorrelation calculating means;

subtracting means for subtracting an output of said summing means from an output of said matched filter means at a position corresponding to a symbol for which a soft decision is made; a complex conjugate means for obtaining a complex conjugate of said symbol for which a soft decision is made;

multiplying means for multiplying an output of said subtracting means by an output of said complex conjugate means; and real portion selection means for obtaining the real portion of an output of said multiplying means.

15. A maximum-likelihood sequence estimation unit, comprising:

transmission path estimating means for estimating an impulse response of a transmission path from an input signal;

hard decision estimating means for estimating a maximum-likelihood transmitted symbol sequence based on said input signal using said impulse response of said transmission path; and soft decision calculating means for calculating a soft decision based on an output of said hard decision estimating means using said input signal and said impulse response of said transmission path.

16. A maximum-likelihood sequence estimation unit according to claim 15, wherein said soft decision calculating means comprises:

first metric calculating means for calculating a metric corresponding to an estimated transmitted symbol sequence output from said hard decision estimating means;

second metric calculating means for generating a symbol sequence in which a symbol located at a position where a soft decision is made in said estimated transmitted symbol sequence is inverted in polarity and for calculating a metric corresponding to said generated symbol sequence;

subtracting means for subtracting a metric obtained by said second metric calculating means from said metric obtained by said first metric calculating means; and multiplying means for multiplying an output of said subtracting means by a symbol located at a position where a soft decision is made in said estimated transmitted symbol sequence.

17. A maximum-likelihood sequence estimation unit according to claim 16, wherein at least one of said metric obtained by the first metric calculating means and said metric obtained by the second metric calculating means is a mean square error between a convolutional integral of said impulse response of a transmission path and said symbol sequence used for calculating a metric, said convolutional integral having been passed through a matched filter, and an output of said matched filter means, or said at least one of said metric obtained by the first metric calculating means and said metric obtained by the second metric calculating means is said mean square error which is multiplied by a constant or to which a constant is added.

18. A maximum-likelihood sequence estimation unit according to claim 16, wherein at least one of said metric obtained by the first metric calculating means and said metric obtained by the second metric calculating means is a value obtained by subtracting an autocorrelation of a cross-correlation between said symbol sequence used for calculating said at least one of said metric obtained by the first metric calculating means and said metric obtained by the second metric calculating means, and said impulse response of a transmission path from a value obtained by doubling the real portion of cross-correlation between a symbol sequence estimated by said hard decision estimating means and the output of said matched filter means, or said at least one of said metric obtained by the first metric calculating means and said metric obtained by the second metric calculating means is said calculated value which is multiplied by a constant or to which a constant is added.

19. A maximum-likelihood sequence estimation unit according to claim 15, wherein said soft decision calculating means comprises:

symbol inverting means for generating a symbol sequence in which a symbol located at a position where a soft decision is made in an estimated transmitted symbol sequence output from said hard decision estimating means is inverted in polarity;

metric calculating means for successively calculating a first metric corresponding to an estimated transmitted symbol sequence output from said hard decision estimating means and a second metric corresponding to said symbol sequence output from said symbol inverting means;

subtracting means for subtracting said second metric from said first metric; and multiplying means for multiplying an output of said subtracting means by a symbol located at a position where a soft decision is made in said transmitted symbol sequence.

20. A maximum-likelihood sequence estimation unit according to claim 19, wherein at least one of said first metric and said second metric is a mean square error between a convolutional integral of said impulse response of a transmission path and said symbol sequence used for calculating a metric, said convolutional integral having been passed through a matched filter, and an output of said matched filter means, or said at least one of said first metric and said second metric is said mean square error which is multiplied by a constant or to which a constant is added.

21. A maximum-likelihood sequence estimation unit according to claim 19, wherein at least one of said first metric and said second metric is a value obtained by subtracting an autocorrelation of a cross-correlation between said symbol sequence used for calculating said at least one of said first metric and said second metric and said impulse response of a transmission path from a value obtained by doubling the real portion of cross-correlation between a symbol sequence estimated by said hard decision estimating means and the output of said matched filter means, or said at least one of said first metric and said second metric is said calculated value which is multiplied by a constant or to which a constant is added.

* * * * *